United States Patent [19]
Tanno et al.

[11] Patent Number: 5,785,752
[45] Date of Patent: Jul. 28, 1998

[54] METHOD FOR THE PREPARATION OF MAGNETIC OXIDE GARNET SINGLE CRYSTAL FOR MAGNETOSTATIC WAVE DEVICE

[75] Inventors: Masayuki Tanno; Toshihiko Ryuo, both of Gunma-ken, Japan

[73] Assignee: Shin-Etsu Chemical Co., Ltd., Japan

[21] Appl. No.: 571,097

[22] Filed: Dec. 12, 1995

[30] Foreign Application Priority Data

Dec. 14, 1994 [JP] Japan .................. 6-310180

[51] Int. Cl.$^6$ .................................. C30B 15/20
[52] U.S. Cl. .................. 117/32; 117/30; 117/35; 117/902; 117/917
[58] Field of Search ............... 117/32, 54, 55, 117/69, 902, 917, 14, 30, 35, 937

[56] References Cited

U.S. PATENT DOCUMENTS 4,555,374 11/1985 Roshmann ................. 264/40.1
5,449,942 9/1995 Tanno et al. ................ 257/421

*Primary Examiner*—Felisa Garrett
*Attorney, Agent, or Firm*—Wenderoth, Lind & Ponack, L.L.P.

[57] ABSTRACT

Proposed is an improvement in the method for the preparation of a chip of an oxide garnet film epitaxially having a specific chemical composition as grown on the surface of a GGG substrate wafer having a crystallographic plane orientation of (111), which is useful as a working element in a magnetostatic wave device such as high-frequency filters, signal noise enhancers, isolators and the like with decreased temperature dependence of the properties. The epitaxially grown single crystal film is adjusted to have such dimensions that the thickness h and the smallest dimension L within the plane of the film satisfy the relationship that the ratio h/L is in the range from 0.001 to 0.25.

2 Claims, 3 Drawing Sheets

METHOD FOR THE PREPARATION OF MAGNETIC OXIDE GARNET SINGLE CRYSTAL FOR MAGNETOSTATIC WAVE DEVICE

BACKGROUND OF THE INVENTION

The present invention relates to a method for the preparation of a magnetic oxide garnet single crystal suitable for use as a working element in a magnetostatic wave device such as filters, resonators, oscillators, signal-noise enhancers, isolators, circulators and the like used in a frequency range from 100 MHz to several tens of GHz.

Proposals have been made in the prior art for magnetostatic wave devices of which the working element is a YIG (yttrium iron garnet) film. Devices of this type has a defect that, due to the large temperature dependency of the saturation magnetization $4\pi Ms$ of the YIG film, the magnetic field applied to the YIG film must be adequately modified depending on the temperature in order to decrease the temperature dependency of the working frequency of the device resulting in a great increase in the costs of the magnetostatic wave devices for the complicated and expensive instrumentation necessitated to accomplish the temperature compensation of the magnetic field. It would be a due idea that the temperature compensation of the magnetic field could be omitted by decreasing the temperature dependency of a YIG film per se to provide a possibility of improving the temperature characteristics of a magnetostatic wave device and to decrease the costs thereof.

Several disclosures are found for the improvement of a YIG film relative to the temperature dependency thereof. For example, H. L. Glass, et al. have reported in Material Research Bulletin, volume 12, pages 735–740 (1977) that the vertical resonance magnetic field of a lanthanum- and gallium-modified YIG having a chemical composition of the formula $La_{0.06}Y_{2.94}Fe_{4.13}Ga_{0.87}O_{12}$, of which the saturation magnetization is 410 G, at a constant temperature is approximately a quadratic function of temperature at around room temperature suggesting a possibility of an improvement in the temperature characteristics. Further, P. Roshmann, et al. have reported in Material Research Bulletin, volume 18, pages 449–459 (1983) that the ferromagnetic resonance (FMR) frequency of a gallium-modified YIG having a chemical composition of the formula $Y_3Fe_{4.07}Ga_{0.93}O_{12}$ under a constant magnetic field is also approximately a quadratic function of temperature at around room temperature to suggest a possibility of stabilization of the resonance frequency relative to the temperature.

The mechanism of the above mentioned effects of temperature compensation can well be explained by the Kittel's equation (1) given below:

$$f=\gamma(Hres-N\cdot 4\pi Ms-4/3\cdot K1/Ms), \qquad (1)$$

relative to the vertical resonance in the crystallographic <111> direction, in which f is the frequency, $\gamma$ is the gyromagnetic ratio, $4\pi Ms$ is the saturation magnetization, Hres is the resonance magnetic field, N is the shape factor of the garnet crystal and K1 is the primary anisotropy constant of a cubic crystal.

Namely, the temperature compensation in the material reported by P. Roshmann, et al. is a consequence of the compensation between the temperature dependencies of the $4\pi Ms$ and the K1. The materials disclosed in the above named literatures, however, are not quite satisfactory for practical applications because the resonance frequency or the resonance magnetic field of these materials varies in a range of as large as 10 MHz or 3×79.6 A/m, respectively, by a temperature variation of 40° C. in the range including room temperature.

T. Ryuo, et al. have reported in IEEE Ultrasonics Symposium Preprints, pages 237–240 (1988) that rapid broadening is noted in the magnetic resonance half-value width $\Delta H$ of a lanthanum- and gallium-modified YIG film on a yttrium-modified GGG (gadolinium gallium garnet) substrate grown by the liquid-phase epitaxial method, which exhibits a similar temperature-compensation effect to the above mentioned materials, when the $4\pi Ms$ thereof is decreased below 500 G.

As is understood from the above described situations, a problem remaining unsolved is that low-loss magnetostatic wave devices can hardly be prepared from the materials for temperature compensation heretofore reported because the effect of temperature compensation is still insufficient and the value of $\Delta H$ is also not as small as desired.

In view of the above described situations, the inventors have disclosed in Japanese Patent Kokai 6-236814 that the above mentioned problems can be solved at least partly with a magnetic oxide garnet single crystal in the form of an epitaxially grown film for magnetostatic wave devices having a chemical composition of the formula $(Bi_xY_{3-x})(Fe_{5-y}M_y)O_{12}$, in which M is Ga and/or Al, the subscript x is a number in the range from 0.002 to 0.4 and the subscript y is a number in the range from 0.6 to 0.8, which is obtained by epitaxial growing on the (111) crystallographic plane of a single crystalline substrate having a lattice constant in the range from 1.2363 nm to 1.2386 nm. This epitaxial garnet film has a growth-induced anisotropy constant $Ku^g$ in the range from $0.3\times10^3$ joules/m$^3$ to $1.5\times10^3$ joules/m$^3$ and the $\Delta H$ value thereof is so small that the temperature dependency of the resonance frequency of a magnetostatic wave device therewith can be small.

When the resonance frequency in this epitaxial film is kept constant, the vertical resonance magnetic field is varied approximately quadratically by the change in the temperature or, namely, the vertical resonance magnetic field is an approximately quadratic function of the temperature. It is usually preferable that the so-called apex temperature, which is the temperature at which the vertical resonance magnetic field has a maximum value relative to the temperature, is in the vicinity of room temperature. Japanese Patent Kokai 6-236814 further discloses a possibility that extraneous magnetic resonances can be removed or the apex temperature can be changed by subjecting the epitaxial film to a heat treatment.

It is a difficult matter to prepare an epitaxially grown film of this type so as to have an apex temperature as desired in the range from −100° C. to +200° C. For example, the temperature in the liquid-phase epitaxial process for the preparation of such an epitaxial film must be controlled within a very narrow range of 0.2° C. in order that the epitaxial film thus prepared may have an apex temperature in the range from 20° to 30° C. Although the apex temperature can be changed by a heat treatment as mentioned above, a problem accompanies the heat treatment that the variation of the resonance magnetic field by the temperature changes is increased with a decrease in the growth-induced magnetic anisotropy by the heat treatment.

SUMMARY OF THE INVENTION

The present invention accordingly has an object to provide, by solving the above described problems in the prior art, a method for the preparation of a magnetic oxide garnet single crystal suitable as a working element in a magnetostatic wave device, of which the apex temperature can be controlled within the range of temperature from −100° C. to +200° C. without substantially increasing the temperature dependence of the resonance magnetic field of an epitaxial film such as those disclosed in Japanese Patent Kokai 6-236814.

Thus, the method for the preparation of a magnetic oxide garnet single crystal provided by the present invention comprises, in a method for the preparation of a magnetic oxide garnet single crystal having a chemical composition expressed by the formula

  (I)

in which M is an element selected from gallium and aluminum, the subscript x is a number in the range from 0.02 to 0.4 and the subscript y is a number in the range from 0.6 to 0.8 and formed by epitaxial growing on the surface of a single crystal substrate having a crystallographic plane orientation of (111) and having a lattice constant in the range from 1.2363 nm to 1.2386 nm, of which the growth-induced anisotropy constant $Ku^g$ in the crystallographic axial direction of <111> is in the range from $0.3 \times 10^3$ to $1.5 \times 10^3$ joules/m$^3$, the steps of:

(a) measuring the first apex temperature, which is the temperature at which the vertical resonance magnetic field as a function of temperature has a maximum value with a constant resonance frequency or the second apex temperature, which is the temperature at which the vertical resonance frequency as a function of temperature has a maximum value under a constant magnetic field for a generally rectangular or generally elliptic planar specimen; and (b) cutting the epitaxially grown magnetic oxide garnet single crystal film in such dimensions that the ratio of h, which is the thickness of the planar single crystal film, to L, which is the smallest dimension within a flat surface of the planar single crystal, is in the range from 0.001 to 0.25.

DETAILED DESCRIPTION OF THE PREFERRED EMBODIMENTS

Figure 1:
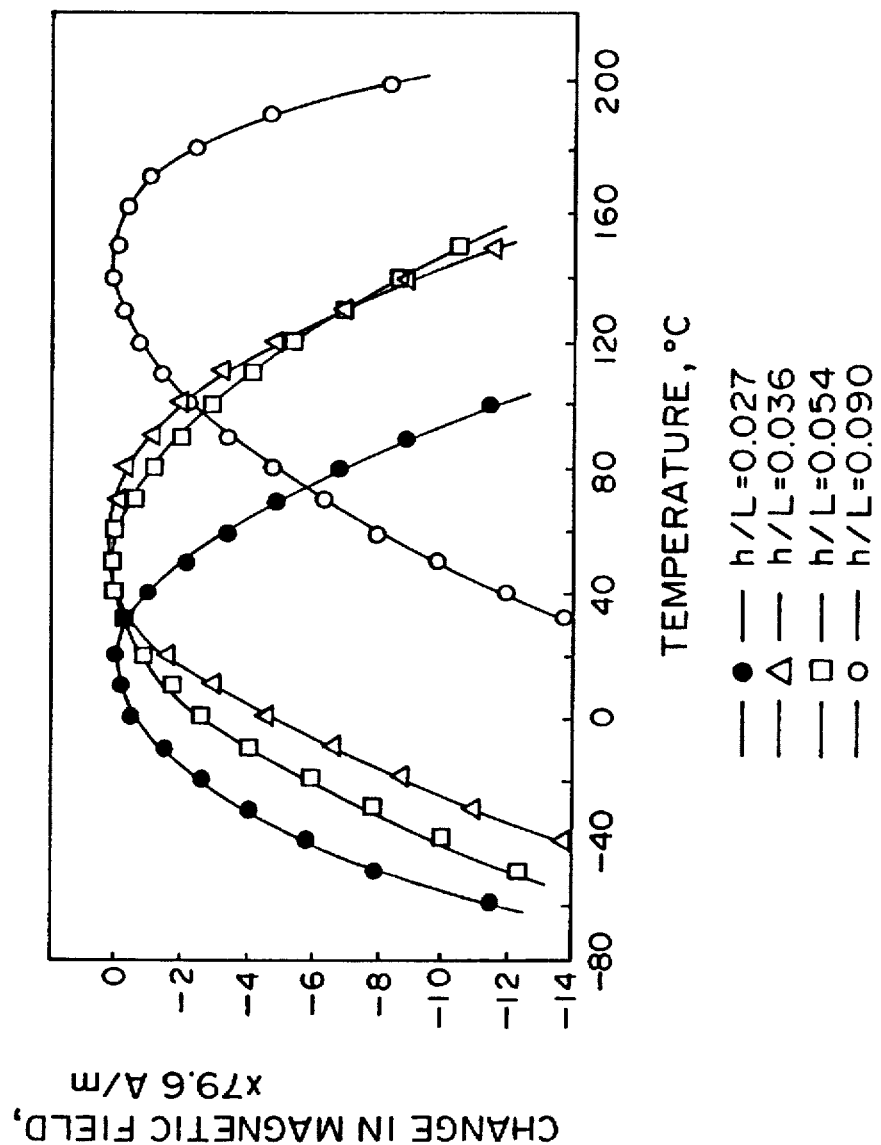
FIG. 1 is a graph showing the variation in the resonance magnetic field as a function of temperature in several specimens having different values of h/L according to the invention.

The single crystal to serve as the substrate of the epitaxially grown magnetic oxide garnet single crystal must have a lattice constant in the range from 1.2363 to 1.2386 nm and is exemplified by known ones including gadolinium gallium garnet, referred to as GGG hereinafter, having a lattice constant of 1.2383 nm and a GGG partially substituted by yttrium having a lattice constant of 1.2367 nm. Such a single crystal of GGG or yttrium-substituted GGG can be prepared by the so-called Czochralski method in which a crucible is charged with gadolinium oxide, gallium oxide and, optionally, yttrium oxide to form a melt of the oxide mixture by high-frequency induction heating, from which a single crystal is pulled up on the lower end of a seed crystal having a crystallographic orientation of <111>. The lattice constant of the thus grown single crystal, which can be measured for a wafer prepared by slicing the single crystal rod in a plane perpendicular to the growing axis and subjected to an etching treatment, for example, with hot phosphoric acid, is within the range from 1.2363 to 1.2386 nm.

The magnetic oxide garnet single crystal according to the present invention is grown by the liquid-phase epitaxial method, referred to as the LPE method hereinafter, on the crystallographic (111) plane of the above mentioned substrate single crystal and has a chemical composition expressed by the formula

  (I)

in which M is an element of gallium or aluminum or a combination thereof, the subscript x is a number in the range from 0.02 to 0.4 and the subscript y is a number in the range from 0.6 to 0.8. This magnetic oxide garnet single crystal is characterized by the growth-induced anisotropy constant Kug in the crystallographic <111> direction having a value in the range from $0.3 \times 10^3$ to $1.5 \times 10^3$ joules/m$^3$.

Although the chemical composition of each of the substrate single crystal and the epitaxially grown single crystal film is known in the prior art, it is important that the combination of the substrate single crystal and the epitaxially grown single crystal is selected such that the mismatching in the lattice constants therebetween falls within the range from −0.0003 to +0.0015 nm so that, when the value of the subscript y in the formula (I) is in the range from 0.6 to 0.8, the value of ΔH can be as small as 1.0 to 1.5 Oe and the above mentioned effect of temperature compensation by K1 can be obtained. The addition of bismuth in the chemical composition of the epitaxially grown single crystal has such an effect that, when the single crystal is epitaxially grown at an appropriate temperature for supercooling so as to generate an anisotropic magnetic field due to the growth-induced magnetic anisotropy and the growth-induced anisotropy constant $Ku^g$ thereof in the crystallographic <111> direction having a value in the range from $0.3 \times 10^3$ to $1.5 \times 10^3$ joules/m$^3$, the above given Kittel's resonance equation (1) is modified with an additional term of $2Ku^g/Ms$ for the growth-induced anisotropic magnetic field to give a modified equation (2) given below resulting in a further improvement in the frequency f of the resonance magnetic field:

$$f = \gamma \cdot (Hres - N \cdot 4\pi Ms - 4/3 \cdot K1/Ms + 2Ku^g/Ms).$$  (2)

When the growth-induced anisotropy constant $Ku^g$ is smaller than $0.3 \times 10^3$ joules/m$^3$, however, no sufficient improvement can be obtained in the temperature compensation even with a chemical composition of the epitaxial single crystal in compliance with the formula (I) because the temperature compensation obtained in such a case is by the conventional 4πMs and K1 only. When the value of $Ku^g$ exceeds $1.5 \times 10^3$ joules/m$^3$, on the other hand, the anisotropic magnetic field is too large so that disadvantages are caused including occurrence of absorption by natural resonance and generation of extraneous magnetostatic wave mode due to an increase in the coupling of the magnetostatic waves to the spin waves.

The present invention has been completed on the base of a discovery that the apex temperature of the resonance magnetic field can be controlled to a desired value within a range from −100° C. to +200° C. while maintaining the small ΔH value of the epitaxial film not exceeding 1.5 Oe and maintaining the small temperature dependence of the resonance magnetic field by appropriately selecting the shape of the epitaxial film specimen by taking note of the antimagnetic field coefficient N in the equation (2) or, namely, by selecting, in a specimen of the epitaxially grown oxide garnet film of the thickness h having a generally rectangular or elliptic form with the smallest dimension L within a flat surface of a generally rectangular or elliptic planar form, the ratio of biL within the range from 0.001 to 0.25. When the value of h/L is too small, a disadvantage is caused that the driving efficiency of the magnetostatic waves cannot be high enough while, when the value of h/L is too large, on the other hand, an increase is caused in the value of ΔH due to occurrence of chippings having a size comparable with the width of the specimen. When the specimen has a form of square or circular disc, the side length of the square or the diameter of the disc should be taken as L. When the specimen has a form of a rectangle or ellipse, the length of the shorter side of the rectangle or the minor axis of the ellipse should be taken as L.

The composite body consisting of a single crystal substrate and an epitaxial film formed thereon by the LPE method can be prepared by a known procedure of the LPE method. For example, a platinum crucible is charged with a blend of the metal oxides to be the constituents of the oxide garnet crystal including yttrium oxide $Y_2O_3$, bismuth oxide $Bi_2O_3$, gallium oxide $Ga_2O_3$ and iron oxide $Fe_2O_3$ as well as lead oxide PbO and boron oxide $B_2O_3$ as the flux materials and the blend is melted by heating at a high temperature into a melt, in which a single crystal substrate such as a wafer of GGG having a flat surface in parallel with the crystallographic (111) plane is dipped with revolution while the temperature of the melt is maintained at a temperature of, for example, 890° C. at which the melt is in a supercooled state so as to grow an epitaxial film of the oxide garnet single crystal on the (111) plane of the substrate.

Taking four specimens of composite bodies consisting of a single crystal substrate and an epitaxial film of an oxide garnet single crystal grown thereon in the above described manner and having different values of h/L, measurements were undertaken for the variation of the vertical resonance magnetic field, which is an approximately quadratic function of temperature as is shown in FIG. 1, with a constant resonance frequency or for the vertical resonance frequency, which is also an approximately quadratic function of temperature under a constant magnetic field on the oxide garnet single crystal, to determine the apex temperature or, namely the temperature at which the vertical resonance magnetic field or vertical resonance frequency, respectively, has a maximum value. The data of the apex temperature obtained in this manner for various specimens having different values of h/L can be plotted as a function of the value of h/L as is shown by the curves in FIG. 2 from which the value of h/L which provides an apex temperature within the desirable range of −100° C. to +200° C. can be obtained. In other words, a specimen of the epitaxially grown oxide garnet single crystal film having a thickness of h has an apex temperature within the desirable range of −100° C. to +200° C. consequently with a small temperature dependence or ΔH when the smallest dimension of the specimen within the flat surface has a value of L determined in this way.

In the following, the present invention is illustrated in more detail by way of examples and comparative examples.

EXAMPLE 1

A platinum crucible was charged with a blend of of yttrium oxide, bismuth oxide, gallium oxide and iron oxide as the constituents of the oxide garnet and lead oxide and boron oxide as the flux materials and the blend was melted by heating at 1100° C. to give a uniform melt which was kept at a temperature of 890° C. to be in a supercooled state corresponding to a temperature decrement of about 50° C. from the saturation temperature of about 940° C.

A single crystal wafer of GGG having a diameter of 50 mm and a thickness of 0.5 mm, of which the flat surface had a crystallographic plane orientation of (111) with a lattice constant of 1.2383 nm, was immersed in the melt with gentle revolution so as to grow an epitaxial film of the oxide garnet single crystal in the crystallographic <111> direction of the substrate single crystal on each of the flat surfaces of the substrate. The epitaxial film on one of the flat surfaces of the substrate was removed by mechanical shaving. The thus obtained oxide garnet single crystal film had a thickness h of 54 μm. The chemical composition of the thus grown epitaxial film of the oxide garnet on the substrate surface could be expressed by the formula $Bi_{0.15}Y_{2.85}Fe_{4.34}Ga_{0.66}O_{12}$ as determined by the ICP analytical method and the lattice constant thereof was 1.2385 nm as determined by the Bond method. The saturation magnetization thereof was 0.73× 79.6 A/m at 25° C. as determined by the vibration method and the value of $Ku^g$ was $1.46 \times 10^3$ joules/m³.

In the next place, the composite body consisting of the substrate wafer and the epitaxial film thereon was cut into square pieces to serve as the test specimens having side lengths of 0.6 mm, 1.0 mm, 1.5 mm and 2.0 mm corresponding to the h/L values of 0.090, 0.054, 0.036 and 0.027, respectively. Each of these test specimens was subjected to the ferromagnetic measurement on a ferromagnetic resonance (FMR) tester to find that the value of ΔH was only 1.0 Oe in each. Further, the vertical resonance magnetic field of the test specimens as a function of temperature with a constant frequency of 9.2 GHz was measured on the FMR tester to give the results shown by the curves in FIG. 1, each of which is a plot of the variation in the vertical resonance magnetic field as a function of temperature. As is understood from this figure, the apex temperature of the respective curves largely depends on the value of h/L. The decrement in the vertical resonance magnetic field from the value at the apex did not exceed 3×79.6 A/m within a broad temperature range of about 80° to 100° C. with the apex temperature at the center of the range.

Figure 2:
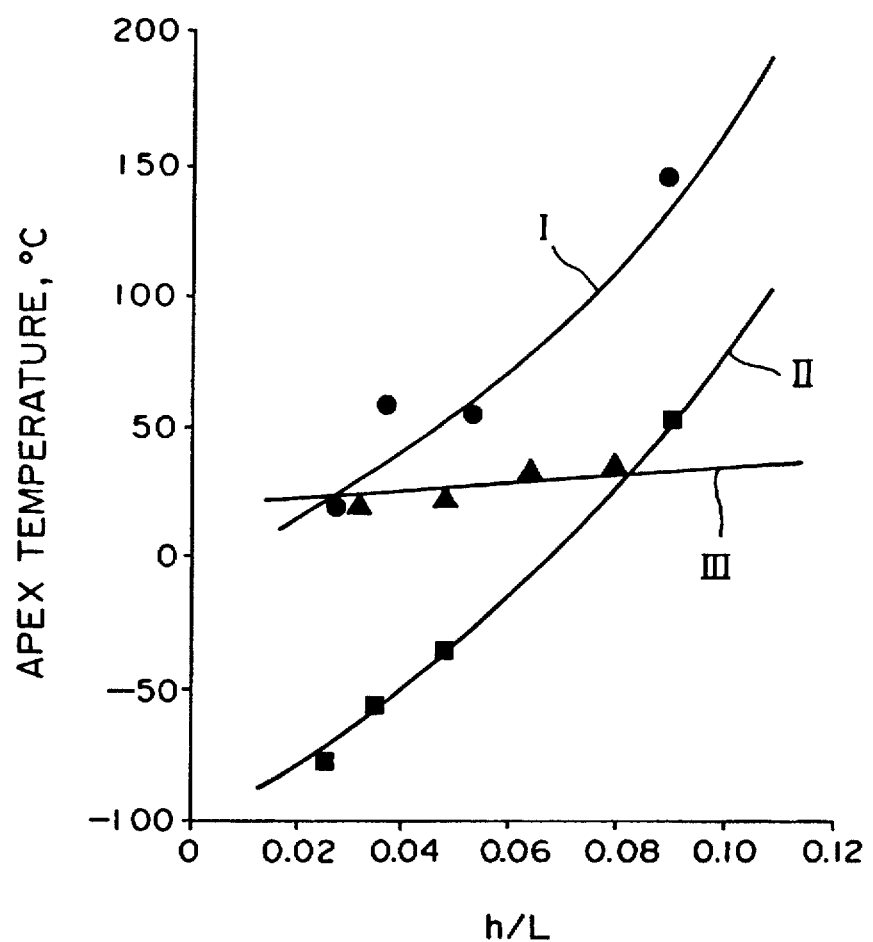
FIG. 2 is a graph showing the apex temperature as a function of the h/L value in the specimens prepared in the Examples and Comparative Examples.

Curve I of FIG. 2 shows the apex temperature obtained in this Example as a function of the value of h/L.

EXAMPLE 2

The experimental procedure was substantially the same as in Example 1 except that the temperature of the melt in the platinum crucible during the process of liquid-phase epitaxy was kept at 890.5° C. The epitaxially grown film of the oxide garnet on the (111) plane of the GGG substrate wafer in the crystallographic <111> axial direction had a thickness of 54 μm and the chemical composition of the oxide garnet could be expressed by the formula $Bi_{0.15}Y_{2.85}Fe_{4.34}Ga_{0.66}O_{12}$. The lattice constant thereof was 1.2385 nm as determined by the Bond method. The saturation magnetization thereof was 0.73×79.6 A/m at 25° C. as determined by the vibration method and the value of $Ku^g$ was $1.26 \times 10^3$ joules/m³.

In the next place, the composite body consisting of the substrate GGG wafer and the epitaxial film thereon was cut into square pieces to serve as the test specimens having side lengths of 0.6 mm, 1.0 mm, 1.5 mm and 2.0 mm corresponding to the h/L values of 0.090, 0.054, 0.036 and 0.027, respectively. Each of these test specimens was subjected to the ferromagnetic- measurement on a ferromagnetic resonance (FMR) tester to find that the value of ΔH was only 1.2 Oe in each. Further, the vertical resonance magnetic field of the test specimens as a function of temperature with a constant frequency of 9.2 GHz was measured on the FMR tester to find that the apex temperature of the respective specimens largely depended on the value of h/L. The decrement in the vertical resonance magnetic field from the value at the apex did not exceed 3×79.6 A/m within a broad temperature range of about 80° C. with the apex temperature at the center of the range.

Curve II of FIG. 2 shows the apex temperature obtained in this Example as a function of the value of h/L.

EXAMPLE 3

The composite body consisting of the substrate wafer and the epitaxial film thereon prepared in Example 1 was cut into rectangular pieces having a constant length of 3.5 mm and a shorter side length, i.e. L, of 0.6 mm, 1.0 mm, 1.5 mm or 2.0 mm to serve as the test specimens, of which the value of ΔH was measured on the FMR tester to find a small value of 1.0 Oe in each. The temperature dependence of the vertical resonance magnetic field of these test specimens was determined at a constant frequency of 9.2 GHz in the same manner as in Example 1 to find that the apex temperature of the respective specimens largely depended on the value of h/L. The decrement in the vertical resonance magnetic field from the value at the apex temperature did not exceed 3×79.6 A/m within a broad temperature range of about 80° to 100° C. with the apex temperature at the center of the range. The apex temperature was plotted on a graph as a function of the value of h/L to find that the plots fell on Curve I of FIG. 2 prepared in Example 1 in good coincidence.

EXAMPLE 4

The composite body consisting of the substrate wafer and the epitaxial film thereon prepared in Example 1 was cut into circular pieces having a diameter, i.e. L, of 0.6 mm, 1.0 mm, 1.5 mm or 2.0 mm to serve as the test specimens, of which the value of ΔH was measured on the FMR tester to find a small value of 1.0 Oe in each. The temperature dependence of the vertical resonance magnetic field of these test specimens was determined at a constant frequency of 9.2 GHz in the same manner as in Example 1 to find that the apex temperature of the respective specimens largely depended on the value of h/L. The decrement in the vertical resonance magnetic field from the value at the apex did not exceed 3×79.6 A/m within a broad temperature range of about 80° to 100° C. with the apex temperature at the center of the range. The apex temperature was plotted on a graph as a function of the value of h/L to find that the plots fell on Curve I of FIG. 2 prepared in Example 1 in good coincidence.

EXAMPLE 5

The composite body consisting of the GGG substrate wafer and the 54 μm thick oxide garnet film epitaxially grown thereon prepared in Example 2 was cut into a square piece having a side length of 0.83 mm corresponding to an h/L value of 0.065, which was used as the working element of a magnetostatic oscillator. With application of a constant magnetic field to this piece in the direction perpendicular to the epitaxial film, the oscillating frequency of the magnetostatic oscillator was measured at varied temperatures to find that the oscillating frequency was approximately a quadratic function of temperature with an apex temperature, i.e. the temperature at which the frequency had a maximum value, was about −20° C. exactly falling on Curve II of FIG. 2 and the decrement of the frequency from the value at the apex temperature did not exceed about 10 MHz within a temperature range of about 80° C. with the apex temperature at the center of the range.

The above used 0.83 mm square piece was reduced in size into a 0.72 mm square piece corresponding to an h/L value of 0.075 by evaporating along the two sides by the irradiation with a YAG laser beam and the thus size-reduced square piece was built in another magnetostatic wave oscillator, of which the oscillating frequency was measured at varied temperatures to find that the oscillating frequency was approximately a quadratic function of temperature with an apex temperature of about 20° C. also exactly falling on Curve II of FIG. 2. The decrement of the frequency from the value at the apex temperature did not exceed about 10 MHz within a temperature range of about 80° C. with the apex temperature at the center of the range.

The above used 0.72 mm square piece was further reduced in size into a 0.60 mm square piece corresponding to an h/L value of 0.090 by evaporating along the two sides by the irradiation with a YAG laser beam and the thus size-reduced square piece was built in another magnetostatic wave oscillator, of which the oscillating frequency was measured at varied temperatures to find that the oscillating frequency was approximately a quadratic function of temperature with an apex temperature of about 50° C. also exactly falling on Curve II of FIG. 2. The decrement of the frequency from the value at the apex temperature did not exceed about 10 MHz within a temperature range of about 80° C. with the apex temperature at the center of the range.

EXAMPLE 6

The composite body consisting of the GGG substrate wafer and the 54 μm thick oxide garnet film epitaxially grown thereon prepared in Example 1 was cut into a square piece having a side length of 0.84 mm corresponding to an h/L value of 0.064 was used as the working element of a magnetostatic wave oscillator. With application of a constant magnetic field to this piece in the direction perpendicular to the epitaxial film, the oscillating frequency of the magnetostatic wave oscillator was measured at varied temperatures to find that the oscillating frequency was approximately a quadratic function of temperature with an apex temperature, i.e. the temperature at which the frequency had a maximum value, was about 110° C. exactly falling on the Curve I of FIG. 2 and the decrement of the frequency from the value at the apex temperature did not exceed about 10 MHz within a temperature range of about 90° C. with the apex temperature at the center of the range.

The above used 0.84 mm square piece was reduced in size into a 0.72 mm square piece corresponding to an h/L value of 0.075 by evaporating along the two sides by the irradiation with a YAG laser beam and the thus size-reduced square piece was built in another magnetostatic wave oscillator, of which the oscillating frequency was measured at varied temperatures to find that the oscillating frequency was approximately a quadratic function of temperature with an apex temperature of about 110° C. also exactly falling on Curve I of FIG. 2. The decrement of the frequency from the value at the apex temperature did not exceed about 10 MHz within a temperature range of about 90° C. with the apex temperature at the center of the range.

The above used 0.72 mm square piece was further reduced in size into a 0.60 mm square piece corresponding to an h/L value of 0.090 by evaporating along the two sides by the irradiation with a YAG laser beam and the thus size-reduced square piece was built in another magnetostatic wave oscillator, of which the oscillating frequency was measured at varied temperatures to find that the oscillating frequency was approximately a quadratic function of temperature with an apex temperature of about 140° C. also exactly falling on Curve I of FIG. 2. The decrement of the frequency from the value at the apex temperature did not exceed about 10 MHz within a temperature range of about 90° C. with the apex temperature at the center of the range.

COMPARATIVE EXAMPLE 1

A platinum crucible was charged with a blend of yttrium oxide, bismuth oxide, gallium oxide and iron oxide as the constituents of the oxide garnet and lead oxide and boron oxide as the flux materials and the blend was melted by heating at 1100° C. to give a uniform melt which was kept at a temperature of 930° C. to be in a supercooled state corresponding to a temperature decrement of about 10° C. from the saturation temperature of about 940° C.

A single crystal wafer of GGG having a diameter of 50 mm and a thickness of 0.5 mm, of which the flat surface had a crystallographic plane orientation of (111) with a lattice constant of 1.2367 nm, was immersed in the melt with gentle revolution so as to grow an epitaxial film of the oxide garnet single crystal in the crystallographic <111> axial direction of the substrate single crystal on both flat surfaces of the substrate. The epitaxial film on one of the substrate surfaces was removed by mechanical shaving. The thus obtained oxide garnet single crystal film had a thickness h of 47 μm. The chemical composition of the thus grown epitaxial film of the oxide garnet on the substrate surface could be expressed by the formula $Bi_{0.06}Y_{2.94}Fe_{4.08}Ga_{0.92}O_{12}$ as determined by the ICP analytical method and the lattice constant thereof was 1.2369 nm as determined by the Bond method. The saturation magnetization thereof was 0.38× 79.6 A/m at 25° C. as determined by the vibration method and the value of $Ku^g$ was $0.00\times10^3$ joules/m$^3$.

Figure 3:
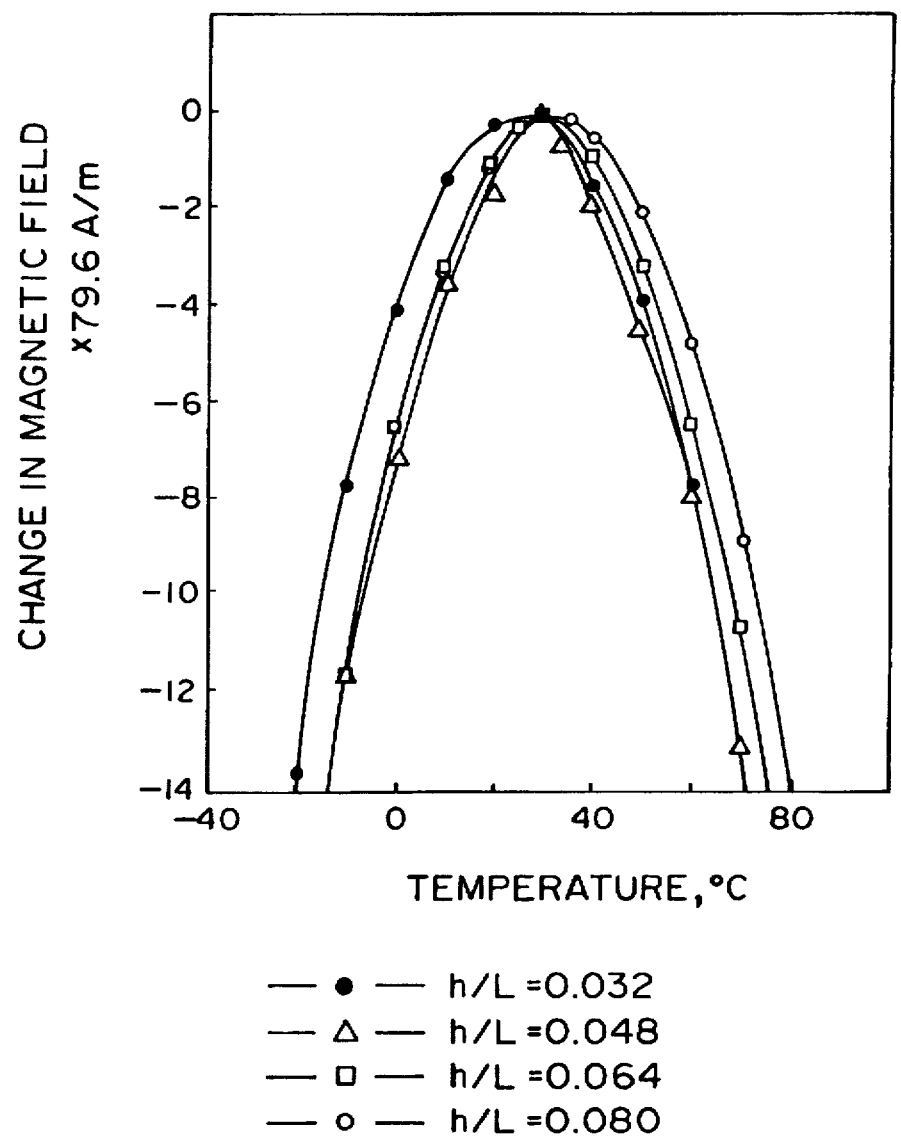
FIG. 3 is a graph showing the variation in the resonance magnetic field as a function of temperature in the specimens prepared in Comparative Example 1 having different values of h/L.

In the next place, the composite body consisting of the substrate GGG wafer and the epitaxial film thereon was cut into square pieces to serve as the test specimens having side lengths of 0.59 mm, 0.74 mm, 0.98 mm and 1.47 mm corresponding to the h/L values of 0.080, 0.064, 0.048 and 0.032, respectively. Each of these test specimens was subjected to the ferromagnetic measurement on a ferromagnetic resonance (FMR) tester to find that the value of ΔH was as large as 4.3 Oe in each. Further, the vertical resonance magnetic field of the test specimens at varied temperatures with a constant frequency of 9.2 GHz was measured on the FMR tester to give the results shown by the curves in FIG. 3, each of which is a plot of the variation in the vertical resonance magnetic field as a function of temperature. As is understood from this figure, the apex temperature of the respective curves little depended on the value of h/L at about 30° to 40° C. The decrement in the vertical resonance magnetic field from the value at the apex did not exceed 3×79.6 A/m, similarly to conventional samples having no growth-induced anisotropic magnetic field, within a broad temperature range of about 40° C. with the apex temperature at the center of the range.

Curve III of FIG. 2 shows the apex temperature obtained in this comparative example as a function of the value of h/L.

COMPARATIVE EXAMPLE 2

The same composite body prepared in Example 1 consisting of the GGG substrate wafer and the epitaxially grown oxide garnet film thereon was cut into square pieces having a side length of 0.2 mm or smaller corresponding to an h/L value larger than 0.27. The ΔH value of these test specimens was 2 Oe or larger presumably due to the influence of chippings on the cutting sections which were no longer negligible as compared with the size of the test piece.

What is claimed is:

1. In a method for the preparation of a magnetic oxide garnet single crystal to serve as a magnetostatic working element having a chemical composition expressed by the formula

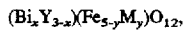

$(Bi_xY_{3-x})(Fe_{5-y}M_y)O_{12}$, in which M is an element selected from the group consisting of gallium and aluminum, the subscript x is a number in the range from 0.02 to 0.4 and the subscript y is a number in the range from 0.6 to 0.8 and formed by liquid-phase epitaxial growing on a surface of a single crystal substrate having a crystallographic plane orientation of (111) and having a lattice constant in the range from 1.2363 to 1.2386 nm, of which the growth-induced anisotropy constant $Ku^g$ in the crystallographic axial direction of <111> is in the range from $0.3\times10^3$ to $1.5\times10^3$ joules/m$^3$, the improvement which comprises:

(a) measuring a first apex temperature, which is the temperature at which a vertical resonance magnetic field as a function of temperature has a maximum value with a constant resonance frequency or a second apex temperature, which is the temperature at which the vertical resonance frequency as a function of temperature has a maximum value under a constant magnetic field for a substantially rectangular or substantially elliptic specimen; and (b) cutting the epitaxially grown magnetic oxide garnet single crystal in such dimensions that the ratio of h, which is the thickness of the single crystal, to L, which is the smallest dimension within a flat surface of the single crystal, is in the range from 0.001 to 0.25.

2. In a method for the preparation of a magnetostatic wave device of which the working element is a magnetic oxide garnet single crystal film having a chemical composition expressed by the formula

$(Bi_xY_{3-x})(Fe_{5-y}M_y)O_{12}$, in which M is an element selected from the group consisting of gallium and aluminum, the subscript x is a number in the range from 0.02 to 0.4 and the subscript y is a number in the range from 0.6 to 0.8 and formed by liquid-phase epitaxial growing on a surface of a single crystal substrate having a crystallographic plane orientation of (111) and having a lattice constant in the range from 1.2363 to 1.2386 nm, of which the growth-induced anisotropy constant $Ku^g$ in the crystallographic axial direction of <111> is in the range from $0.3\times10^3$ to $1.5\times10^3$ joules/m$^3$, the improvement which comprises:

(a) determining an apex temperature, which is the temperature at which a vertical resonance frequency as a substantially quadratic function of temperature under a constant magnetic field applied to the magnetostatic wave device has a maximum value; and (b) subjecting the magnetic oxide garnet single crystal film as the working element of the magnetostatic wave device to an adjustment of the dimensions in such a way that the ratio of h, which is the thickness of the magnetic oxide garnet single crystal film to L, which is the smallest dimension within the plane of the magnetic oxide garnet single crystal film is in the range from 0.01 to 0.25.

* * * * *